(12) United States Patent
Hsieh

(10) Patent No.: US 6,927,642 B2
(45) Date of Patent: Aug. 9, 2005

(54) DUTY CYCLE CORRECTION METHOD FOR FREQUENCY SYNTHESIS

(75) Inventor: Yi-Bin Hsieh, Taipei (TW)

(73) Assignee: Via Technologies, Inc., Shidian (TW)

(*) Notice: Subject to any disclaimer, the term of this patent is extended or adjusted under 35 U.S.C. 154(b) by 0 days.

(21) Appl. No.: 10/810,016

(22) Filed: Mar. 26, 2004

(65) Prior Publication Data

US 2004/0178837 A1 Sep. 16, 2004

Related U.S. Application Data

(63) Continuation of application No. 10/270,893, filed on Oct. 15, 2002, now Pat. No. 6,737,927.

(30) Foreign Application Priority Data

Dec. 4, 2001 (TW) ........................... 90221097 U

(51) Int. Cl.[7] .................................................. H03L 1/00
(52) U.S. Cl. ...................... 331/175; 331/1 A; 331/74; 327/175; 327/176
(58) Field of Search ............................. 331/34, 74, 1 A, 331/175; 327/113, 115, 172, 175, 176; 377/47

(56) References Cited

U.S. PATENT DOCUMENTS 6,380,778 B2 * 4/2002 Uehara et al. ............... 327/175
6,404,840 B1   6/2002 Sindalovsky ................. 377/48

* cited by examiner

*Primary Examiner*—Arnold Kinkead
(74) *Attorney, Agent, or Firm*—Volpe and Koenig, P.C.

(57) ABSTRACT

A duty cycle correction method converts a pair of differential analog signals from an oscillator into an output pulse signal with 50% of duty cycle. The pulse signal has the same frequency as that of each of the differential analog signals. The duty cycle correction method processes the pair of differential analog signals into a first digital pulse signal and a second digital pulse signal, wherein the first digital pulse signal and the second digital pulse signal have a specified phase difference therebetween, frequency-divides the first digital pulse signal and the second digital pulse signal into a third digital pulse signal and a fourth digital pulse signal, and generates the output pulse signal according to the third and fourth digital pulse signals. The output pulse signal can be generated by performing an exclusive OR operation of the third and fourth digital pulse signals.

10 Claims, 9 Drawing Sheets

DUTY CYCLE CORRECTION METHOD FOR FREQUENCY SYNTHESIS

CROSS REFERENCE TO RELATED PATENT APPLICATION

This patent application is a continuation application (CA) of a U.S. patent application Ser. No. 10/270,893 filed Oct. 15, 2002, now U.S. Pat. No. 6,737,927, issued May 18, 2004. The content of the related patent application is incorporated herein for reference.

FIELD OF THE INVENTION

The present invention relates to a duty cycle correction method, and more particularly to a duty cycle correction method for frequency synthesis.

BACKGROUND OF THE INVENTION

FIG. 1(a) is a functional block diagram of a conventional frequency synthesizer. A control-voltage signal Vcntl is delivered from a control-voltage generating device 10, which is composed of a phase detector (PD) or a phase-frequency detector (PFD) 11, a charge pump 12 and a loop filter 13, into a voltage-control oscillator (VCO) 14. In accordance with the voltage level of the control-voltage signal Vcntl, the voltage-control oscillator (VCO) 14 delivers a pair of differential analog signals fp0 and fp180 into a differential-to-single-ended buffer circuit 15. The differential analog signals fp0 and fp180 are converted into a single-ended signal and further amplified into a digital signal Fvco by means of the differential-to-single ended buffer circuit 15. Such digital signal Fvco is fed back into the phase detector (PD) or the phase-frequency detector (PFD) 11 by a divided-by-N counter 17 to be compared with a reference frequency signal Fref and thus control the voltage level of the control-voltage signal Vcntl. Therefore, a digital signal Fvco with a stable waveform is obtained in accordance with the relation of Fvco=Fref×N.

FIGS. 2 and 3 are respectively circuit diagrams of the voltage-control oscillator 14 and the differential-to-single-ended buffer circuit 15. The voltage-control oscillator 14 includes three delay circuits DELAY 1, DELAY 2 and DELAY 3 for processing the control-voltage signal Vcntl and thus outputting the pair of differential analog signals fp0 and fp180. The differential-to-single-ended buffer circuit 15 is implemented by employing four MOSFETs (Metal Oxide Semiconductor Field Effect Transistors), i.e. MN1, MN2, MP1 and MP2, and two inverters, i.e. INV1 and INV2. The operation and principle of the differential-to-single-ended buffer circuit 15 are well known in the art and need not be further described in details herein. Since the loads on the drain terminals MN1 and MN2 are asymmetrical, the duty cycle would possibly be distorted. In addition, the bandwidth of the differential-to-single-ended buffer circuit 15 might vary with the extrinsic parameters, for example device processing temperature, voltage and/or frequency of the frequency synthesizer, the variation of which also distorts the duty cycle. Especially when the frequency synthesizer is operated at different frequencies, the duty cycle distortion is beyond control. For example, the data transfer rate of a CD-ROM/DVD-ROM read-out circuit for the radially outer portion of a disc is approximately 2.5 times as large as that for the radially inner portion. Therefore, the duty cycle distortion occurs due to the frequency difference in the same oscillator. For the above reasons, it is difficult to effectively maintain the duty cycle of the digital signal Fvco at 50%.

The distortion of the duty cycle of the digital signal Fvco away from 50% will result in a poor bit-error rate and an inferior lock-in range of a clock and data recovery circuit, and is thus required to be improved. The prior art with reference to FIG. 1(a) uses a divide-by-two circuit 16 connected with the differential-to-single-ended buffer circuit 15 to solve this problem. By dividing the frequency of the digital signal Fvco by two, the duty cycle distortion can be disregarded, and a pulse signal CLKO of a duty cycle 50% is obtained, as shown in FIG. 1(b).

However, the above frequency synthesizing method has some disadvantages. For example, the frequency of the digital signal Fvco has to double in advance in order to obtain the pulse signal CLKO of a desired frequency. Thus, the power consumption of the frequency synthesizer and the complexity of the divide-by-two circuit 16 are increased. This disadvantage is apparent especially when the working frequency of the current central processing unit (CPU) is as high as several gigahertz.

SUMMARY OF THE INVENTION

Therefore, the present invention provides a duty cycle correction method for frequency synthesis, which facilitates reducing power consumption and circuit complexity and still allows the output pulse signal to be fixed at a 50% duty cycle.

In accordance with an aspect of the present invention, there is provided a duty cycle correction method for converting a pair of differential analog signals from an oscillator into an output pulse signal having the same frequency as that of each of the pair of differential analog signals and 50% duty cycle. The method comprises steps of: processing the pair of differential analog signals into a first digital pulse signal and a second digital pulse signal, wherein the first digital pulse signal and the second digital pulse signal have a specified phase difference therebetween; frequency-dividing the first digital pulse signal and the second digital pulse signal into a third digital pulse signal and a fourth digital pulse signal; and generating the output pulse signal according to the third and fourth digital pulse signals.

In an embodiment, the specified phase difference is 180 degrees. The first digital pulse signal is frequency-divided by two to obtain the third digital pulse signal, and the second digital pulse signal is frequency-divided by two to obtain the fourth digital pulse signal.

Preferably, the duty cycle correction method comprises a step of performing an exclusive OR operation of the third and fourth digital pulse signals for generating the output pulse signal.

According to another aspect of the present invention, a frequency synthesizing method comprises steps of: generating a pair of differential analog signals; processing the pair of differential analog signals into a first digital pulse signal and a second digital pulse signal, wherein the first digital pulse signal and the second digital pulse signal have a specified phase difference therebetween; frequency-dividing the first digital pulse signal and the second digital pulse signal into a third digital pulse signal and a fourth digital pulse signal; and generating an output pulse signal according to the third and fourth digital pulse signals, wherein the output pulse signal having the same frequency as that of each of the pair of differential analog signals and 50% duty cycle.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1A:
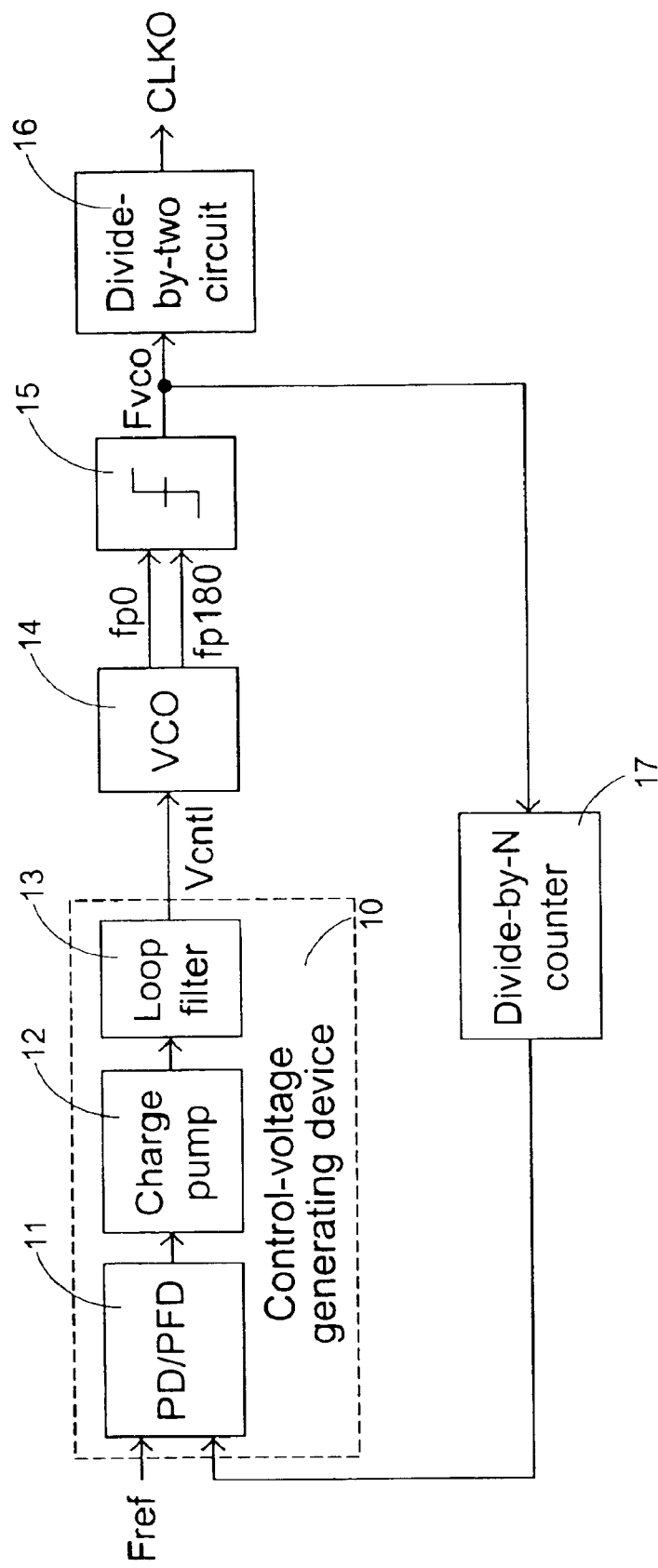
FIG. 1(a) is a functional block diagram of a typical frequency synthesizer.
Figure 1B:
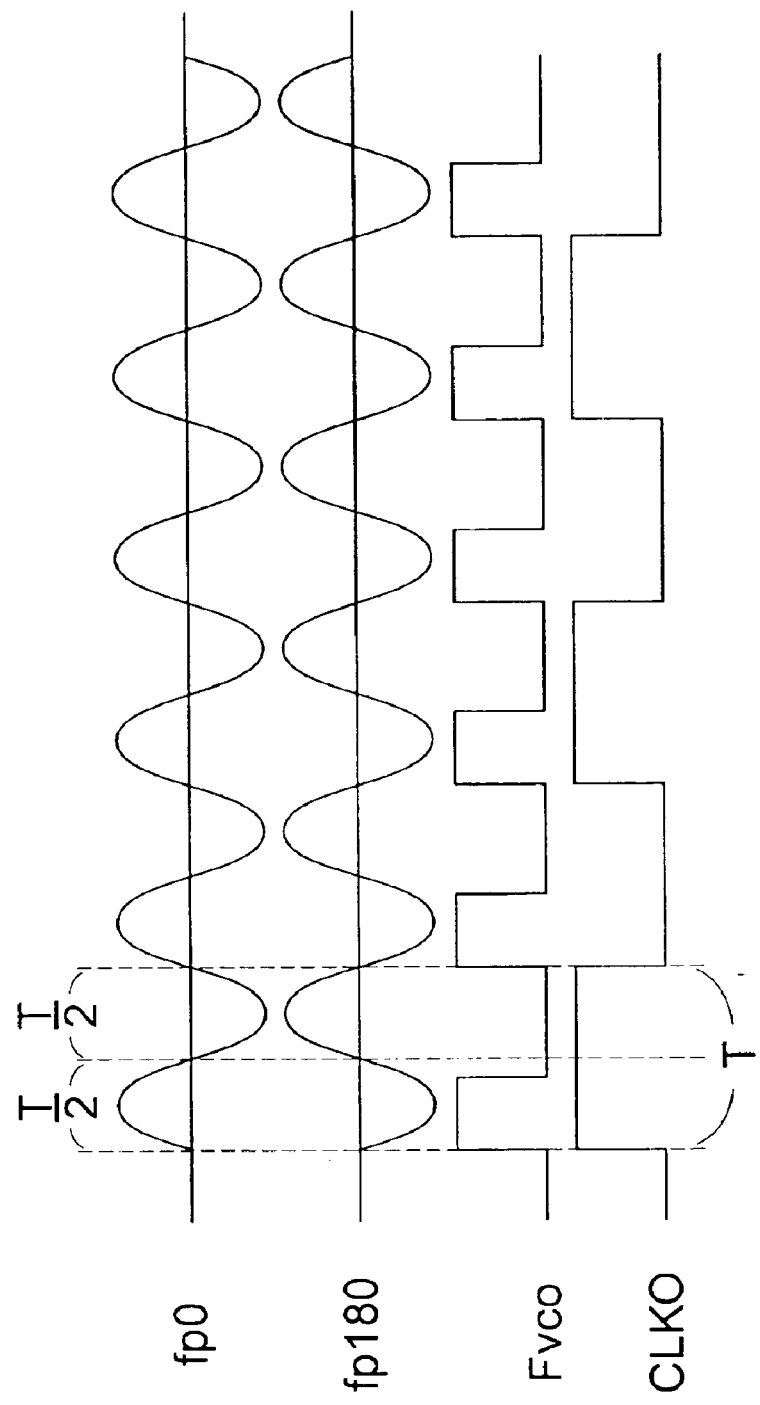
FIG. 1(b) is a timing waveform diagram illustrating the corresponding signals processed by the divide-by-two circuit in FIG. 1(a)
Figure 2:
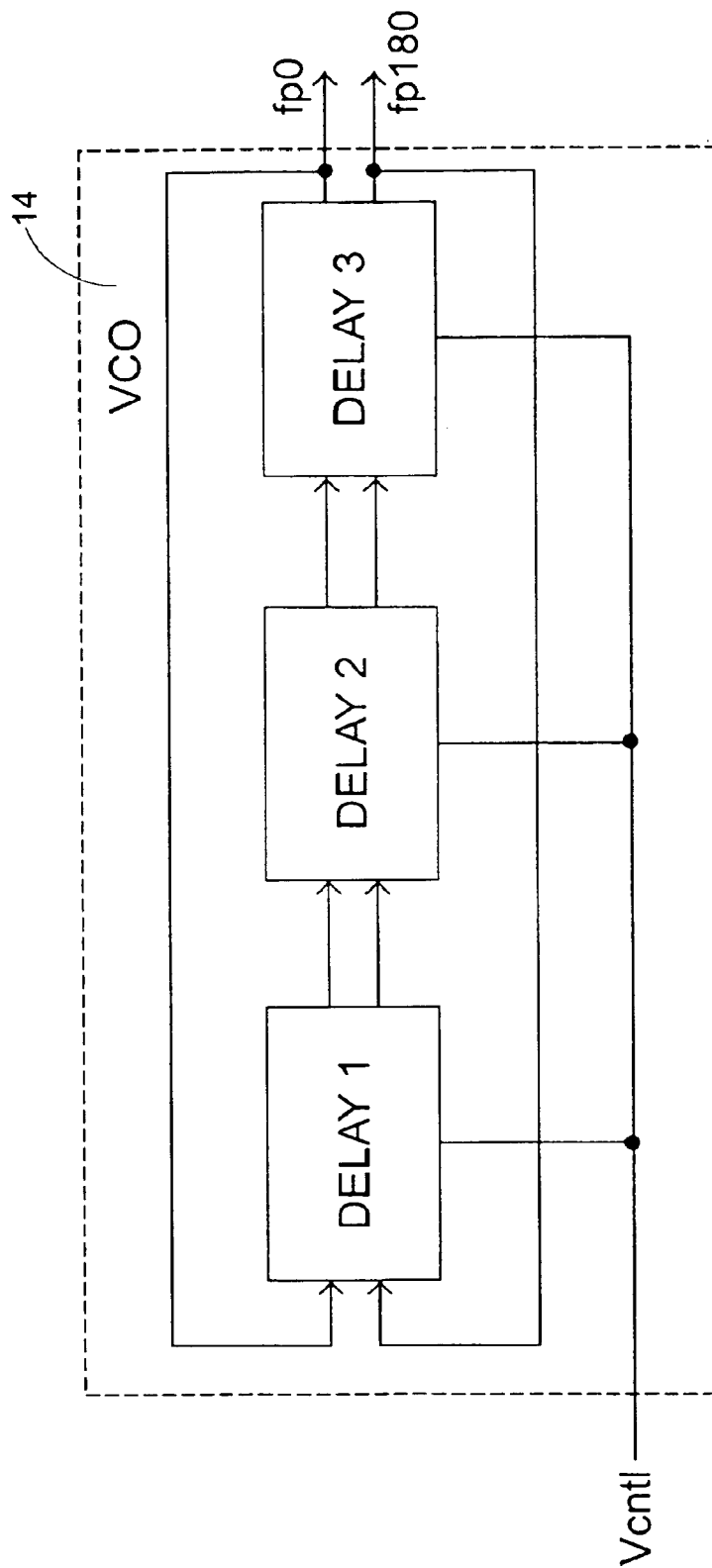
FIG. 2 is a simplified circuit diagram of a voltage-control oscillator of the frequency synthesizer in FIG. 1.
Figure 3:
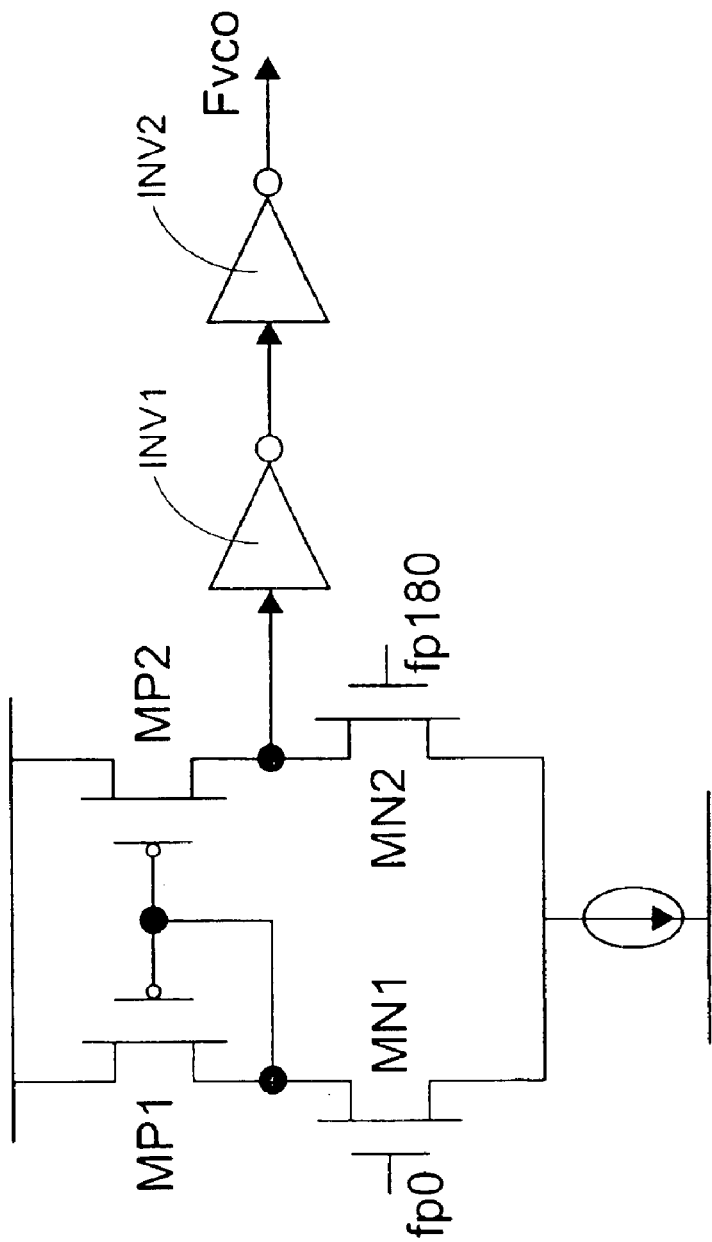
FIG. 3 is a detailed circuit diagram of a differential-to-single-ended buffer circuit of the frequency synthesizer in FIG. 1.
Figure 4:
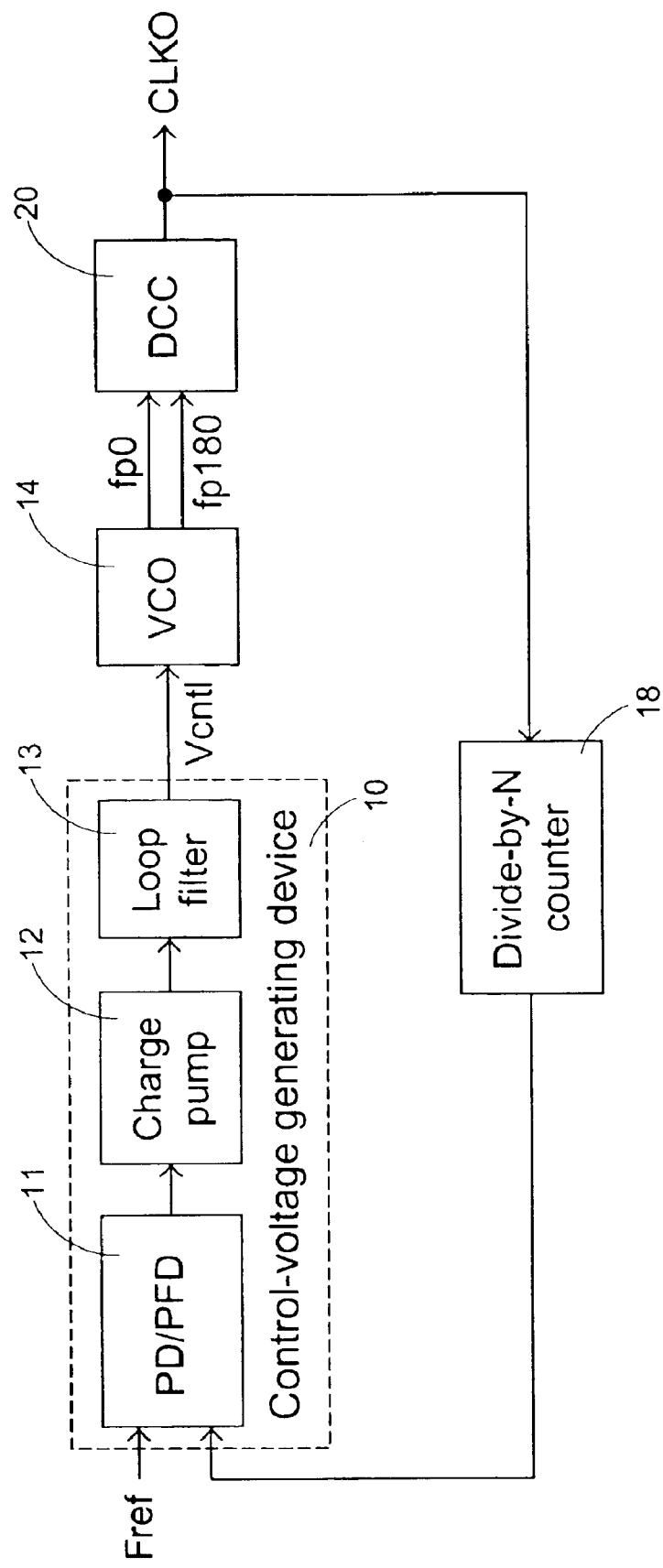
FIG. 4 is a functional block diagram of a frequency synthesizer according to a preferred embodiment of the present invention.

FIG. 4 is a functional block diagram showing a frequency synthesizer according to a preferred embodiment of the present invention. A control-voltage signal Vcntl is delivered from a control-voltage generating device 10, which is composed of a phase detector (PD) or a phase-frequency detector (PFD) 11, a charge pump 12 and a loop filter 13, into a voltage-control oscillator (VCO) 14. In accordance with the voltage level of the control-voltage signal Vcntl, the voltage-control oscillator (VCO) 14 delivers a pair of differential analog signals fp0 and fp180 into a differential-to-single-ended buffer circuit 15, wherein there is a phase difference of 180 degree between the signals fp0 and fp180. The differential analog signals fp0 and fp180 are processed by a duty cycle correction (DCC) circuit 20 so as to produce a pulse signal CLKO of a duty cycle 50%. The pulse signal CLKO is fed back into the phase detector (PD) or the phase-frequency detector (PFD) 11 by a divided-by-N counter 17 to be compared with a reference frequency signal Fref and thus control the voltage level of the control-voltage signal Vcntl. Therefore, a digital signal CLKO with a stable waveform is obtained in accordance with the relation of CLKO=Fref×N.

Figure 5A:
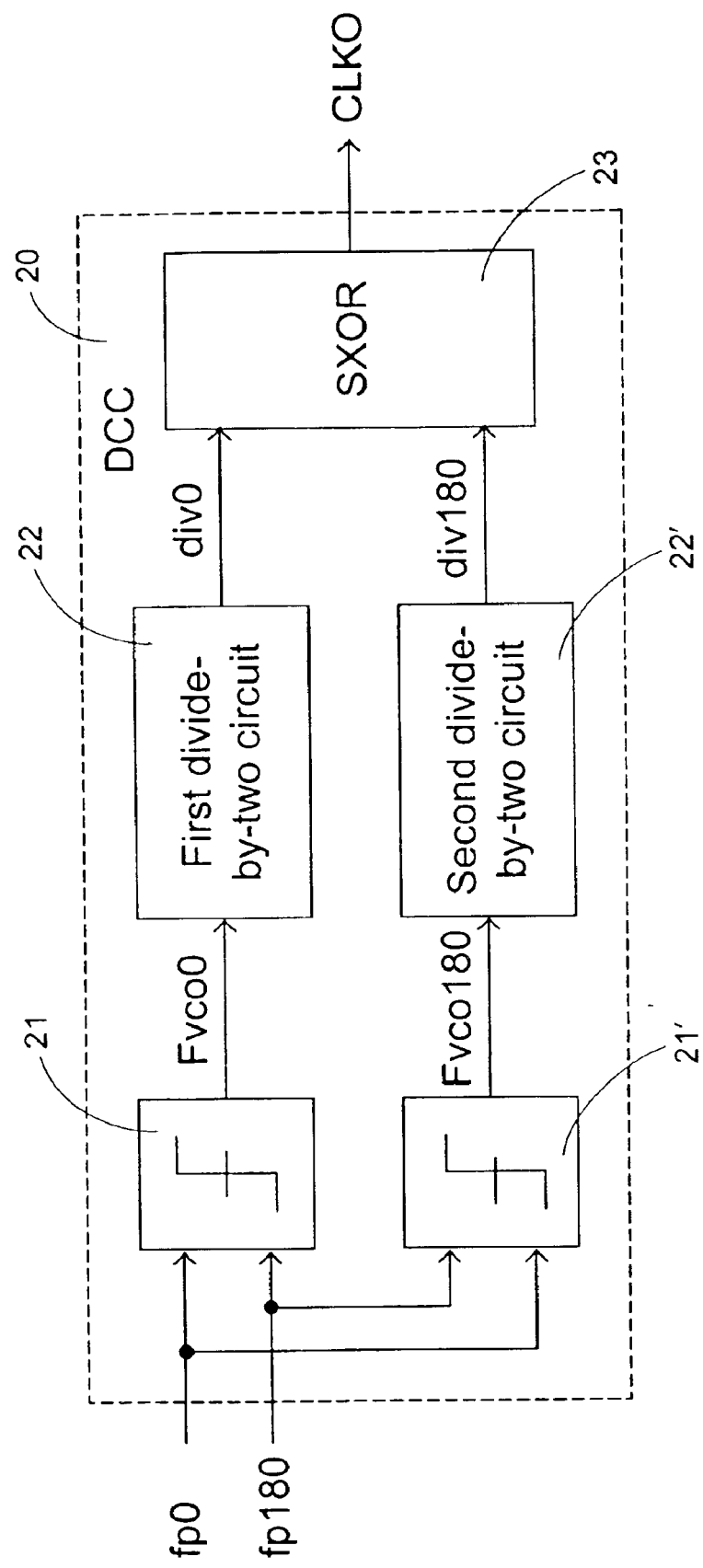
FIG. 5(a) is a block functional diagram of a duty cycle correction circuit in FIG. 4.
Figure 5B:
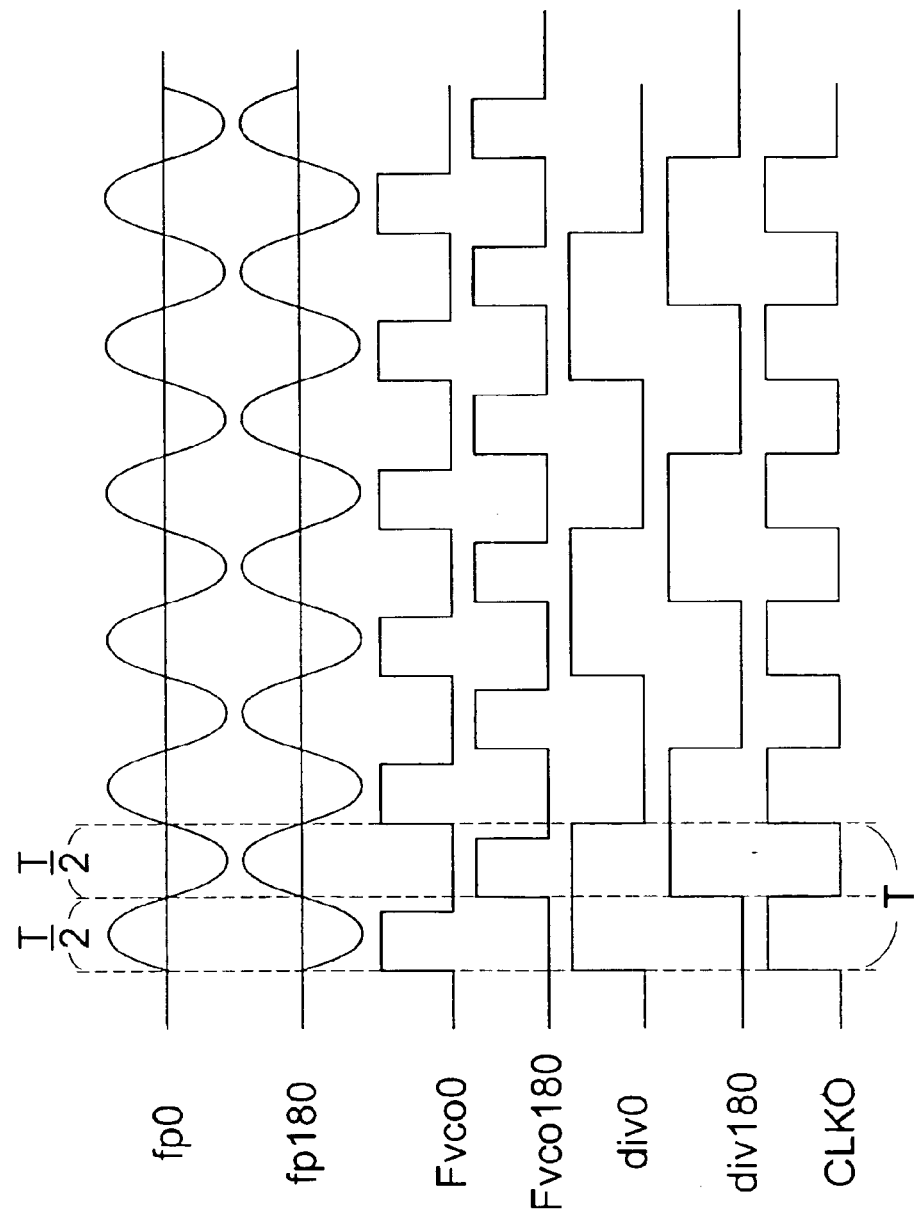
FIG. 5(b) is a timing waveform diagram illustrating the corresponding signals processed by the duty cycle correction circuit in FIG. 4.

Please refer to FIGS. 5(a) and 5(b). The pair of differential analog signals fp0 and fp180 with a period T delivered from the voltage-control oscillator 14 are processed, by a first differential-to-single-ended buffer circuit 21 and a second differential-to-single-ended buffer circuit 21', into a first digital pulse signal Fvco0 and a second digital pulse signal Fvco180, respectively. Although the digital pulse signals Fvco0 and Fvco180 are not fixed at a 50% duty cycle, as can be seen in FIG. 5(b), the phase difference between their rising edges is still 180 degrees. Subsequently, the digital pulse signals Fvco0 and Fvco180 are frequency-divided, by a first divide-by-two circuit 22 and a second divide-by-two circuit 22', into a third digital pulse signal div0 and a fourth digital pulse signal div180, wherein each of the digital pulse signals div0 and div180 is fixed at a 50% duty cycle. Meanwhile, the frequency is reduced to a half, and the period becomes 2T. The signals div0 and div180 are then inputted into a symmetrical exclusive OR (SXOR) gate 23, and thus an exclusive OR operation is performed therein so as to produce the output pulse signal CLKO. As can be found in FIG. 5(b), the frequency of output pulse signal CLKO is the same as that of the voltage-control oscillator 14, and the duty cycle is corrected into 50%. Therefore, it is not necessary to double the frequency in advance as in the prior art. In such way, the power consumption can be greatly reduced.

Figure 6A:
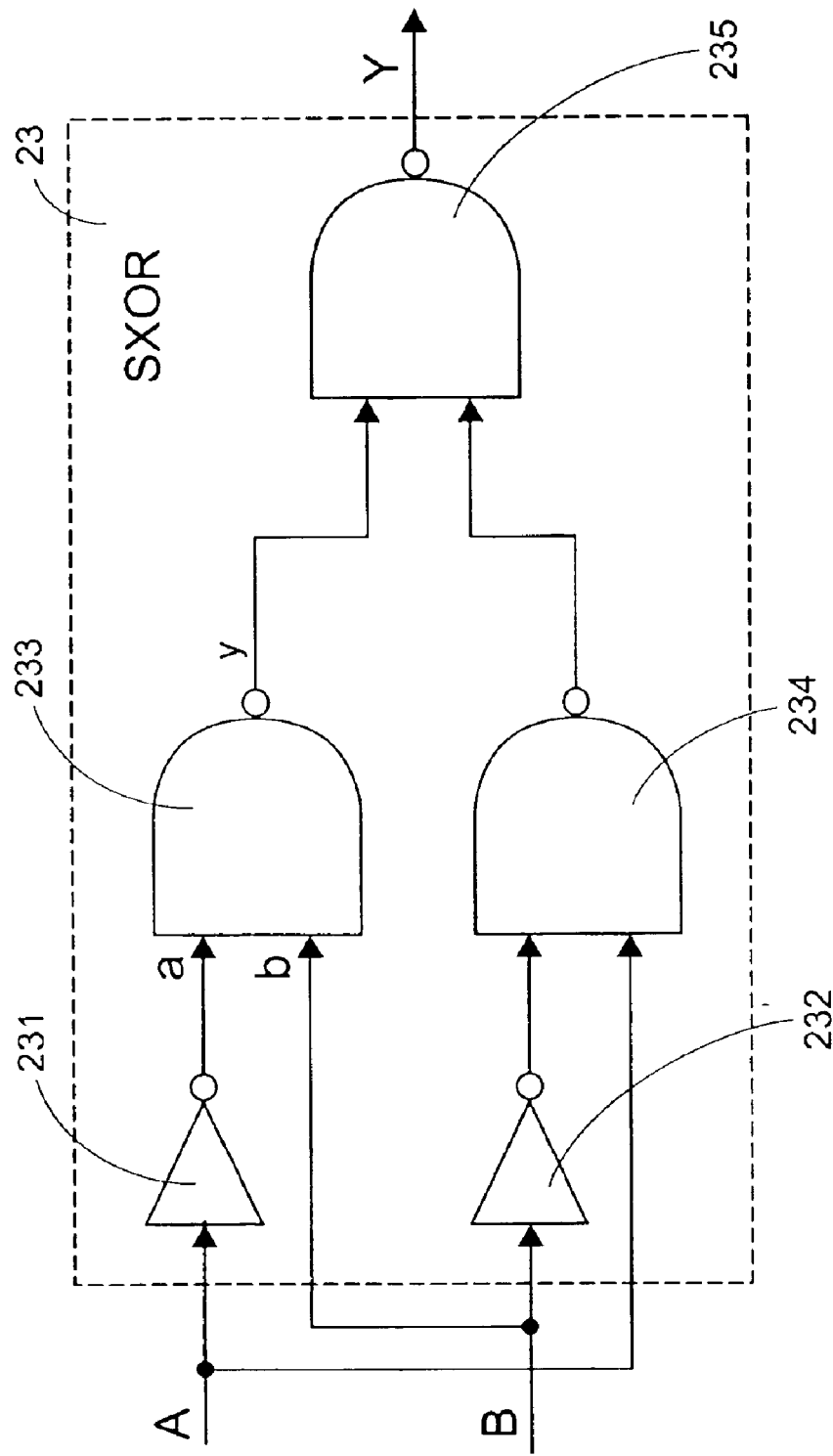
FIG. 6(a) is a logical diagram of a symmetrical exclusive OR gate applied to the duty cycle correction circuit of the present invention.

Referring to the embodiment of FIG. 6(a), the symmetrical exclusive OR gate 23 applied to the duty cycle correction circuit of the present invention includes two inverters 231 and 232, and three symmetrical NAND gates 233, 234 and 235. In another embodiment, the NAND gates 233, 234 can be asymmetrical. By employing this symmetrical exclusive OR gate 23, the delay time between the input signal A and the output signal Y is the same as that between the input signal B and the output signal Y. In FIG. 6(a), the output ends of the inverters 231 and 232 are electrically connected with the first input ends of the NAND gates 233 and 234, respectively. The output ends of the NAND gates 233 and 234 are respectively connected with a first input end and a second input end of the third NAND gate 235. The input signal A is inputted into the inverter 231 and a second input end of the NAND gate 234, and the input signal B is inputted into the inverter 232 and a second input end of the NAND gate 233. It is noted that the signals A, B and Y correspond to the signals div0, div180 and CLKO in FIG. 5(a), respectively.

Figure 6B:
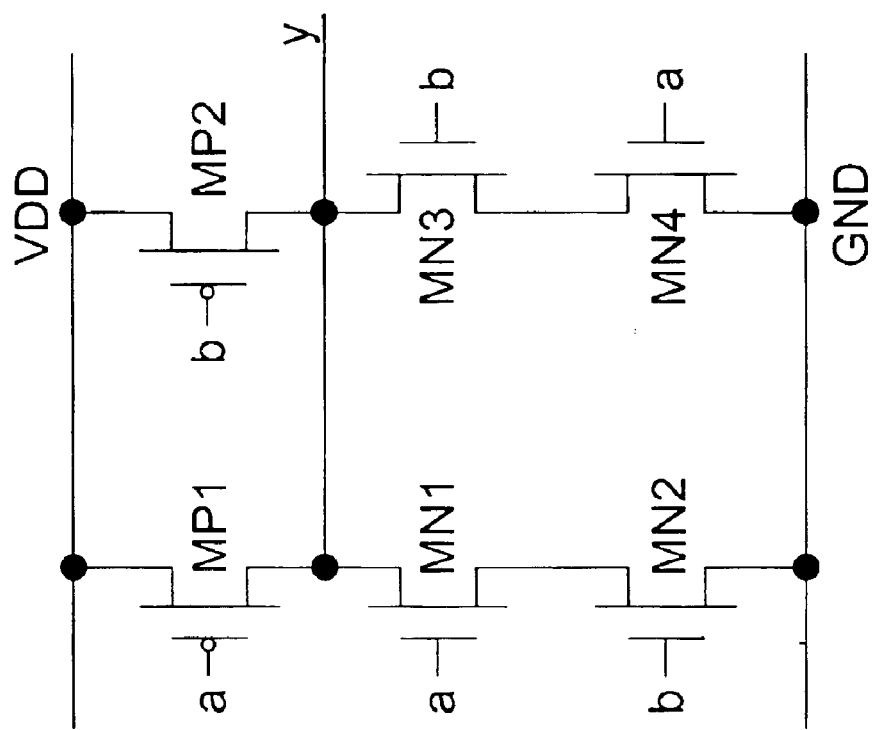
FIG. 6(b) is a detailed circuit diagram of a symmetrical NAND gate in FIG. 6(a).

Referring to FIG. 6(b), each of the symmetrical NAND gates 233, 234 and 235 can be implemented by two PMOS transistors MP1 and MP2 and four NMOS transistors NM1, NM2, NM3 and NM4. The PMOS transistor MP1 is connected with the NMOS transistors MN1 and MN2 in series. The PMOS transistor MP2 is connected with the NMOS transistors NM3 and NM4 in series. The source terminals of MP1 and MP2 are connected to a power supply voltage VDD, and the source terminals of NM2 and NM4 are grounded to GND. The gate terminals of PM1, NM1 and NM4 are interconnected to form a first input end a of the symmetrical NAND gate 233, 234 or 235. The gate terminals of PM2, NM2 and NM3 are interconnected to form a second input end b of the symmetrical NAND gate 233, 234 or 235. The drain terminals of PM1 and PM2 are interconnected to form an output end y of the symmetrical NAND gate 233, 234 or 235. The delay time from point a to y is the same as that from point b to y.

It is understood from the above description, the duty cycle correction method of the present invention can allow the output pulse signal CLKO to be fixed at a 50% duty cycle without doubling the frequency of the digital signal Fvco delivered from the oscillator. Therefore, the above-mentioned problems in the prior art can be greatly reduced. Moreover, the duty cycle correction method of the present invention can be applied to central processing units (CPUs), chipsets, CDs/DVDs, phase-locked loop and a variety of frequency synthesizers for frequency synthesis. Especially when it is applied to a clock and data recovery circuit, the bit-error rate and the lock-in range can be greatly enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A duty cycle correction method for converting a pair of differential analog signals from an oscillator into an output pulse signal having the same frequency as that of each of said pair of differential analog signals and 50% duty cycle, said method comprising steps of:

processing said pair of differential analog signals into a first digital pulse signal and a second digital pulse signal, wherein said first digital pulse signal and said second digital pulse signal have a specified phase difference therebetween;

frequency-dividing said first digital pulse signal and said second digital pulse signal into a third digital pulse signal and a fourth digital pulse signal; and signal having the same frequency as that of each of said pair of differential analog signals and 50% duty cycle by performing an exclusive OR operation of said third and fourth digital pulse signals.

2. The duty cycle correction method according to claim 1 wherein said specified phase difference is 180 degrees.

3. The duty cycle correction method according to claim 1 wherein said first digital pulse signal is frequency-divided by two to obtain said third digital pulse signal, and said second digital pulse signal is frequency-divided by two to obtain said fourth digital pulse signal.

4. A frequency synthesizing method, comprising steps of:

generating a pair of differential analog signals;

processing said pair of differential analog signals into a first digital pulse signal and a second digital pulse signal, wherein said first digital pulse signal and said second digital pulse signal have a specified phase difference therebetween;

frequency-dividing said first digital pulse signal and said second digital pulse signal into a third digital pulse signal and a fourth digital pulse signal; and generating an output pulse signal by performing an exclusive OR operation of said third and fourth digital pulse signals, wherein said output pulse signal having the same frequency as that of each of said pair of differential analog signals and 50% duty cycle.

5. The frequency synthesizing method according to claim 4 wherein said differential analog signals have the same frequency and a phase difference of 180 degrees.

6. The frequency synthesizing method according to claim 4 wherein said first digital pulse signal is frequency-divided by two to obtain said third digital pulse signal, and said second digital pulse signal is frequency-divided by two to obtain said fourth digital pulse signal.

7. A duty cycle correction method for converting a pair of differential analog signals from an oscillator into an output pulse signal, said method comprising steps of:

processing said pair of differential analog signals into a first digital pulse signal and a second digital pulse signal, wherein said first digital pulse signal and said second digital pulse signal have a specified phase difference therebetween, and the frequency of said first and second digital pulse signals is the same as that of said pair of differential analog signals;

frequency-dividing said first digital pulse signal and said second digital pulse signal into a third digital pulse signal and a fourth digital pulse signal, wherein the frequency of said third and fourth digital pulse signals is a fraction of that of said pair of differential analog signals; and generating said output pulse signal having the same frequency as that of each of said pair of differential analog signals and 50% duty cycle according to said third and fourth digital pulse signals.

8. The duty cycle correction method according to claim 7 wherein said differential analog signals have the same frequency and a phase difference of 180 degrees.

9. The duty cycle correction method according to claim 7 wherein said first digital pulse signal is frequency-divided by two to obtain said third digital pulse signal, and said second digital pulse signal is frequency-divided by two to obtain said fourth digital pulse signal.

10. The duty cycle correction method according to claim 7 comprising:

performing an exclusive OR operation of said third and fourth digital pulse signals for generating said output pulse signal.

* * * * *